(12) United States Patent
Moors et al.

(10) Patent No.: US 7,361,911 B2
(45) Date of Patent: Apr. 22, 2008

(54) LITHOGRAPHIC APPARATUS AND DEVICE MANUFACTURING METHOD

(75) Inventors: Johannes Hubertus Josephina Moors, Helmond (NL); Robertus Nicodemus Jacobus Van Ballegoij, Eindhoven (NL); Vadim Yevgenyevich Banine, Helmond (NL); Gert-Jan Heerens, Schoonhoven (NL); Frederik Theodorus Elisabeth Heuts, Eindhoven (NL); Johannes Henricus Wilhelmus Jacobs, Eindhoven (NL); Paulus Martinus Maria Liebregts, Veldhoven (NL); Hendrik Antony Johannes Neerhof, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 477 days.

(21) Appl. No.: 11/007,579

(22) Filed: Dec. 9, 2004

(65) Prior Publication Data

US 2006/0127811 A1 Jun. 15, 2006

(51) Int. Cl.
*B21D 53/84* (2006.01)
(52) U.S. Cl. .................. 250/492.2; 430/302; 430/297
(58) Field of Classification Search ................ 430/302
See application file for complete search history.

(56) References Cited

U.S. PATENT DOCUMENTS

| | | | |
|---|---|---|---|
| 5,559,584 A * | 9/1996 | Miyaji et al. | 355/73 |
| 6,369,874 B1 | 4/2002 | del Puerto | |
| 6,576,912 B2 * | 6/2003 | Visser et al. | 250/492.2 |
| 6,614,505 B2 | 9/2003 | Koster et al. | |
| 6,683,936 B2 * | 1/2004 | Jonkers | 378/34 |
| 6,841,342 B2 * | 1/2005 | Nishi et al. | 430/330 |
| 2003/0071979 A1 * | 4/2003 | Visser | 355/30 |

FOREIGN PATENT DOCUMENTS

| | | |
|---|---|---|
| EP | 0 532 968 A1 | 3/1993 |
| EP | 0 957 402 A2 | 1/1999 |
| EP | 0 957 402 A3 | 3/2000 |
| EP | 1 422 568 A2 | 5/2004 |

* cited by examiner

*Primary Examiner*—Jack I. Berman
*Assistant Examiner*—Andrew Smyth
(74) *Attorney, Agent, or Firm*—Pillsbury Winthrop Shaw Pittman LLP

(57) ABSTRACT

A device manufacturing method includes projecting a patterned beam of radiation through an optics compartment and a channel that provides an open connection between the optics compartment and a substrate compartment onto a substrate, maintaining an ionized flush gas at a higher pressure in the channel than in the substrate compartment and in the optics compartment during the projecting, intercepting particles that emanate from the substrate with the ionized flush gas, pumping the flush gas carrying the intercepted particles from the substrate compartment using a pump coupled to a gas outlet coupled to at least one of the compartments, and establishing an electrical potential difference between a wall of the channel and the outlet and/or a rotor of the pump so that the outlet and/or the rotor of the pump attracts positively charged ions that stem from the flush gas in the channel.

22 Claims, 4 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

European Patent Application No. EP-A-0 957 402 describes that a lithographic apparatus may suffer from the problem that gas phase contaminants may cause deterioration of optical elements (mirror lenses and/or transmissive lenses) that are used to image the pattern onto the layer of radiation-sensitive material on the substrate. The resist material in particular is a source of light molecules that evaporate from the resist during irradiation of the substrate. This may be a particular problem when (E)UV irradiation is used to transfer the pattern, but to a lesser extent, similar problems may arise also when longer irradiation wavelengths are used.

EP-A-0 957 402 discloses a solution to this problem. A tube is provided between an optics compartment of the lithographic apparatus that contains optical elements, and a substrate compartment that contains the substrate. The imaging radiation passes through this tube. A gas flow also passes through this tube to carry away (flush) the contaminants from the substrate compartment before they reach the optic compartment. Typically, a gas inlet is provided on one side of the tube and a pump is coupled to another side of the tube. Gases, such as Ar or Kr, that are relatively transparent for the imaging radiation are used. As EP-A-0 957 402 points out, these gases have a low diffusion coefficient for contaminants, that is, the majority of the contaminants will not be able to reach the optics compartment before they are carried away by the gas flow.

Nevertheless, it has been found that a considerable gas flow strength may be needed to ensure that a satisfactory amount of contaminants is carried away. This may require heavy pumping, which means that considerable overhead is may be needed to prevent vibrations from the pumps from affecting the imaging process. The heavy pumping may complicate the design of the lithographic apparatus and its maintenance. Also, the high flow strength may require relatively high pressure, which may have drawbacks, such as increased absorption, secondary emission, and damage to the optical elements.

U.S. Pat. No. 6,614,505 describes the problem of contaminants that emerge from the radiation source that is used to generate the radiation with which the pattern is imaged onto the substrate. A plasma source may be used for example. U.S. Pat. No. 6,614,505 describes several approaches to remove these contaminants before they flow from the radiation source to the optics compartment of the lithographic apparatus. U.S. Pat. No. 6,614,505 mentions that these solutions may also be used between the substrate compartment and the optics compartment.

U.S. Pat. No. 6,614,505 proposes the use of charged getter electrodes to attract contaminants before they can reach the optical elements. U.S. Pat. No. 6,614,505 is primarily concerned with contaminants that evaporate as neutral particles from the radiation source. U.S. Pat. No. 6,614,505 discloses how these particles are charged to ensure that they are attracted by the getter electrodes. U.S. Pat. No. 6,614,505 discloses several methods of charging the particles. According to a first method, an electron source is provided adjacent a tube that connects the compartment where the radiation source is located and the optics compartment. The electron source emits electrons that ionize the contaminant particles in the tube so that they will be attracted by the getter electrodes. According to a second method, a plasma (a gas containing ions and free electrons) is maintained in the tube by applying an RF electromagnetic field to noble gas that is present in the tube. The plasma ionizes the contaminants which are subsequently attracted to the charged walls of the tube, which serve as getter electrodes in this case.

SUMMARY

It is an aspect of the present invention to reduce the gas flow strength of flush gas that is needed to remove sufficient contaminants before these contaminants reach the optics compartment.

It is an aspect of the present invention to increase the efficiency with which contaminants may be removed before the contaminants reach the optics compartment.

It is an aspect of the present invention to reduce the amount of contaminants that may flow to the optics compartment as much as possible.

In an embodiment, a device manufacturing method is provided. The method includes patterning a beam of radiation, positioning a substrate in a substrate compartment, and projecting the patterned beam of radiation through an optics compartment and a channel that provides an open connection between the optics compartment and the substrate compartment onto the substrate. The method also includes maintaining an ionized flush gas at a higher pressure in the channel than in the substrate compartment and in the optics compartment during the projecting, intercepting particles that emanate from the substrate with the ionized flush gas, and pumping the flush gas carrying the intercepted particles from the substrate compartment using a pump coupled to a gas outlet of the substrate compartment coupled to at least one of the compartments. The method further includes establishing an electrical potential difference between a wall of the channel and the outlet and/or a rotor of the pump so that the outlet and/or the rotor of the pump attracts positively charged ions that stem from the ionized flush gas in the channel.

In an embodiment, a lithographic projection apparatus that is arranged to project a patterned beam of radiation from a patterning device onto a substrate is provided. The lithographic projection apparatus includes a substrate compartment with a first gas outlet, an optics compartment with a second gas outlet, a channel that provides open gas and radiation communication between the optics compartment and the substrate compartment, and a flush gas supply and flush gas ionizer arranged to establish a higher pressure of ionized flush gas in the channel than in the substrate compartment and the optics compartment. The apparatus also includes a pump coupled to at least one of the gas outlets for pumping the flush gas from at least one of the compartments, and an electric circuit arranged to establish an electrical potential difference between a wall of the channel and at least one of the outlets and/or a rotor of the pump. The circuit has a polarity so that at least one outlet and/or the rotor of the pump attracts positively charged ions that stem from the ionized flush gas in the channel.

In an embodiment, a device manufacturing method is provided. The method includes patterning a beam of radiation, and projecting the beam onto a substrate in a walled substrate compartment. The beam is projected through a walled optics compartment and a walled channel that provides and open connection between the optics compartment and the substrate compartment. The method also includes ionizing a flush gas outside the channel, and supplying the ionized flush gas into the channel from an inlet in a wall of the channel, between the substrate compartment and the optics compartment.

In an embodiment, a device manufacturing method is provided. The method includes patterning a beam of radiation, and placing a plurality of substrates and patterning devices in a path of the beam successively. The substrates or patterning devices are placed on a support structure. The method also includes projecting the beam from the patterning devices onto the substrates, to impart patterns to the substrates for further processing, and electrically charging an electrically exposed area on the support structure to a surface potential different from a wall potential of a wall of a compartment that contains the support structure, during a period between projections of the beam onto successive ones of the substrates and wherein no substrate that is used for further processing or patterning device is on the support structure. The method further includes positioning the support structure with the charged, electrically exposed area during the period at a position to attract material from a space near the position, and removing the attracted material from the support structure before placing a next one of the substrates or the patterning devices on the support structure.

In an embodiment, a lithographic projection apparatus that is arranged to project a pattern from a patterning device onto a substrate is provided. The lithographic projection apparatus includes a support structure for supporting the substrate or the patterning device during projection of the pattern. The support structure is in a compartment. The apparatus also includes an electrical potential application circuit, arranged to establish a surface potential of an electrically exposed area on the support structure in a region that is normally occupied by the substrate or the patterning device during projection. The electrical potential application circuit is arranged to establish mutually different surface potentials relative to a wall potential of a wall of the compartment selectively during selected periods.

In an embodiment, a lithographic projection apparatus that is arranged to project a patterned beam of radiation from a patterning device onto a substrate is provided. The lithographic projection apparatus includes a walled substrate compartment with a gas outlet, a walled optics compartment with a gas outlet, a walled channel that provides open gas and radiation communication between the optics compartment and the substrate compartment, a flush gas ionizer with an output for supplying ionized flush gas, and a flush gas inlet in a wall of the channel between the optic compartment and the substrate compartment, coupled to the output, for feeding ionized flush gas into the channel.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
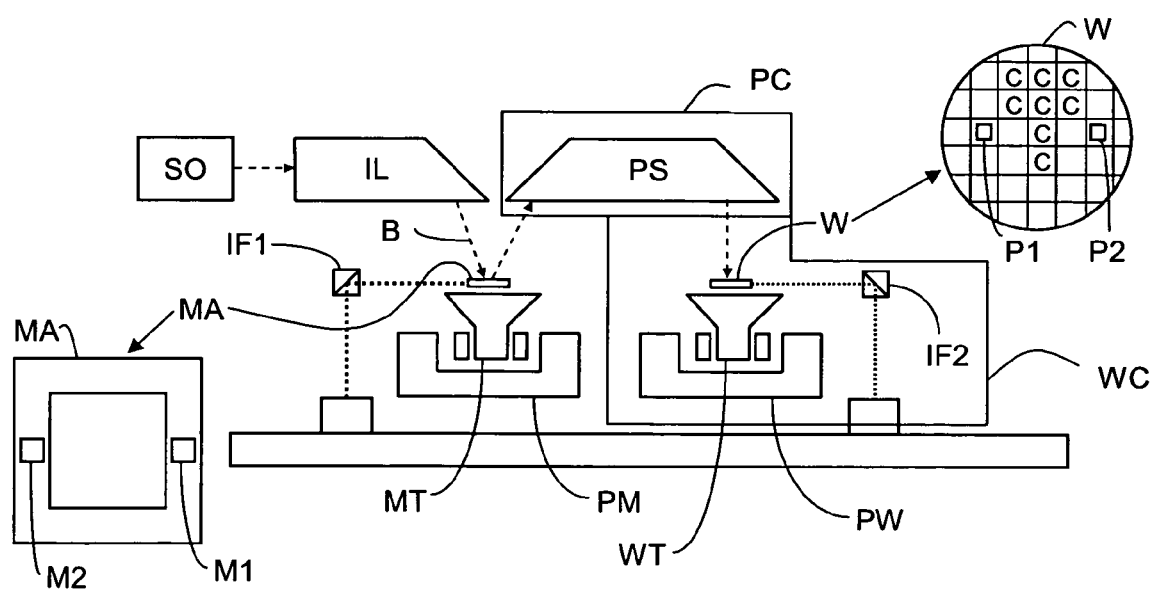
FIG. 1 depicts a lithographic apparatus according to an embodiment of the invention.

FIG. 1 schematically depicts a lithographic apparatus according to one embodiment of the invention. The apparatus includes: an illumination system (illuminator) IL configured to condition a radiation beam B (e.g. UV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate, for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if needed, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following example modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally, a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Flush gas is supplied at the connection between the projection lens PS and the substrate W to prevent contaminants that have emanated from the substrate from reaching the optical elements of the projection lens PS. It has been found that an ionized flush gas is much more effective in intercepting contaminants, even neutral contaminant particles, than a neutral flush gas. This applies both to molecules and/or atoms and to larger particles, of, for example, more than 10 nanometer diameter. Typically, the interaction between ions and (neutral) atoms is 10 times stronger than neutral atom-atom interactions. As a result, a small ionized flush gas flow strength suffices to drag along the same amount of particles as a much larger non-ionized flush gas flow strength, so that less pumping is needed to achieve the same effect.

In contrast to the teaching of the prior art, this method does not rely on charging of the contaminants. Accordingly, measures directed at charging the contaminants are not necessary, which makes it possible to concentrate on efficient ionization of the flush gas so that no excessive amount of flush gas is needed. For example, the flush gas may be ionized before it is fed to the region where the flush gas intercepts the contaminants. In this way, the ionization process has no effect on the contaminants (which are not significantly present where the flush gas is ionized), and an efficient ionization process may be used. As another example, the use of getter electrodes for attracting and depositing contaminants may be avoided, with efficient pumping of the ionized gas with the (neutral) contaminants being emphasized.

Charged contaminants have a tendency to stick to various parts of the apparatus, from where they may later emerge at unpredictable times, and cause damage to, for example, the processed substrates. The charged contaminants that remain are preferably removed between certain substrate patterning operations.

Figure 2:
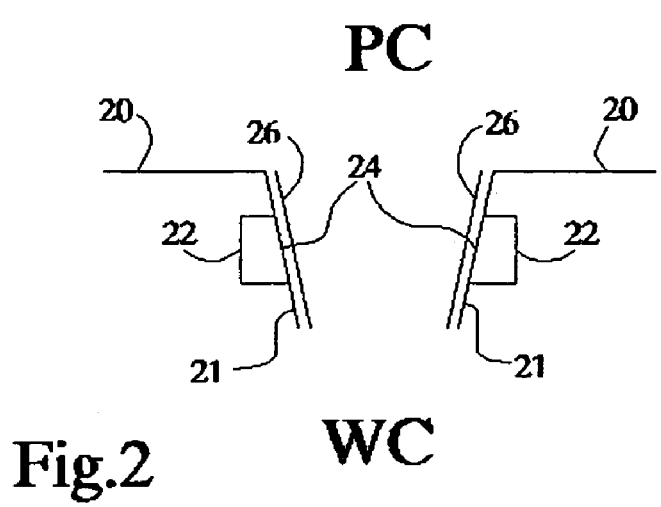
FIG. 2 shows a cross-section of the lithographic apparatus at an interface between compartments that house the substrate and the optics, the interface including electrodes suitable for ionizing flush gas.

FIG. 2 shows a schematic cross-section of a part of the lithographic apparatus, at the separation between compartments WC and PC that house the substrate W and the optical elements of projection lens PS, respectively. A wall 20 between these compartments PC, WC is attached to a cone shaped channel wall 21. Channel wall 21 forms a channel through which projection beam B passes from projection lens PS to substrate W during exposure of substrate W. The diameter of the channel is large enough to sufficiently pass the beam but is preferably no larger. Channel wall 21 has a perforated area 24 which preferably extends full circle around the axis of the cone. A supply chamber 22 is attached to channel wall 21 outside the cone, so that an inside of the supply chamber communicates with at least part of perforated area 24. Preferably, supply chamber 22 extends full circle around the axis of the cone. Inside the channel wall 21, electrodes 26 are provided, which are electrically connected to a radio-frequency voltage source (not shown).

In operation, when the substrate is illuminated with the patterned beam B, the beam B passes through the cone formed by channel wall 21. At least during illumination, flush gas is supplied to supply chamber 22. The flush gas may be, for example, argon, but other gases may be used. The flush gas flows through perforations in perforated area 24 into the inner space of the cone. Pumps (not shown) pump gas from projection optics compartment PC and substrate compartment WC. As a result, flush gas flows from the inner space of the cone to the projection optics compartment PC and substrate compartment WC. RF voltages are applied to electrodes 26 to excite an electromagnetic RF field in the inner space of the cone, with a frequency and amplitude, so that the flush gas may be ionized in the inner space of the cone. Typical RF frequencies are 13.56 or 27.12 Mhz when argon is used, for example.

The ionized flush gas in the inner space of the cone efficiently intercepts particles that arrive from the substrate W. The collision cross-section of the flush gas ions (the effective target area presented to particles that arrive from the substrate W) is much larger than that of non-ionized flush gas molecules. As a result, the particles are carried away with the flush gas, as the flush gas is pumped away from the cone.

Figure 2A:
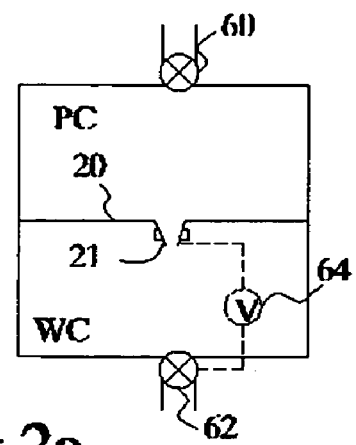
FIG. 2a shows a substrate compartment and a projection optics compartment with pumps coupled to the respective compartments.

FIG. 2a shows a part of a lithographic apparatus with a substrate compartment WC and a projection optics compartment PC with pumps 60, 62 coupled to the respective compartments. A DC voltage source 64 is shown symbolically (using dashed lines). DC voltage source 64 has poles connected to channel wall 21 and to pump 62. Preferably, pump 62 has an electrically conductive rotor electrically coupled to the voltage source. Alternatively or in addition, an electrically conductive grid may be placed in front of the rotor. Preferably, an electrically conductive wall 20 is provided for the compartment WC from which the pump 62 pumps the gas. In one embodiment, the conductive wall 20 is electrically connected to channel wall 21 and electrically isolated from pump 62 or from the grid. In this embodiment, conductive wall 20 and channel wall 21 are preferably both grounded.

In operation, DC voltage source 64 applies a voltage difference between pump 62 and channel wall 21. The electric potential at the pump (at its rotor, or on the grid in front of the rotor) is lowered relative to the electric potential at the channel wall. In this way, ionized gas from the space within the channel walls 21 is pumped from a compartment with increased efficiency, because ions from this space between the channel walls are directly attracted by an electric field from the pump inlet, or at least because the electric field from the pump inlet attracts ions from other regions, thereby increasing the net flow of ions that stem from the channel into these regions.

Although DC voltage source 64 is shown connected to one pump 62, it must be understood that instead DC voltage source 64 may be connected to the other pump 60 or to both pumps 60, 62. When both pumps 60, 62 are connected in this way, additional pumping efficiency may be realized. When one pump 60, 62 is connected in this way, it may be ensured that a majority of the gas is pumped to one pump 60, 62 in one of the compartments PC, WC, so that the effect of the gas on the other compartment may be reduced.

The ionized gas typically contains positively charged ions and electrons, but the latter are typically quickly absorbed by the walls. The ionized gas is neutralized in pump 62, from which an electric countercurrent flows back through the voltage source 64 to the channel walls where most of the electrons are absorbed. Thus, the voltage source 64 is part of an electric current circuit that closes a current loop involving flow of the ionized gas. Typically, pumps 60, 62 are located immediately adjacent to the compartments PC, WC, so that the rotors substantially adjoin the plane of the walls of the compartments PC, WC. In an embodiment, the housings of the pumps directly form the outlets from the walls of the compartments PC, WC. Alternatively, outlet pipes may be provided between the walls of the compartments PC, WC and the housings of the pumps 60, 62.

In an embodiment, the outlet of the pump 62 whose rotor is at a negative potential relative to the channel wall (be it the housing of the pump or the pipe) and the walls are electrically isolated from the rotor and the outlet is at the electrical potential of the walls. In another embodiment, the connections between the outlet of the pump 62 whose rotor is at a negative potential relative to the channel wall (be it the housing of the pump or the pipe) and the walls are electrically isolated from the walls of the compartment. In this embodiment, the outlet is at a negative electrical potential relative to the channel wall. In this way, the outlet provides for the back current. Preferably, in this case, the rotor of the pump 62 is at the same potential as the outlet.

In a further embodiment, the walls 20 may be of isolating material. In this case, charge from the ionized flush gas may accumulate on the walls 20, so that they will assume a potential that repels the flush gas, thereby forcing the ionized flush gas to flow to the outlets. Any objects in the optics compartment and/or the substrate compartment (e.g. reflector lenses, lens support structures and/or cooling elements) may be electrically coupled to the channel wall, to bring them at a higher potential than the rotor and/or the outlet (whichever is at a negative potential with respect to the channel wall), preferably at the same potential as the channel wall, or a more positive potential so that these objects repel or at least do not attract ionized gas. The objects may also be electrically isolating so that they accumulate charge that repels the ionized gas.

Although an embodiment has been described in which only the rotor and/or outlet of the pump 62 that pumps flush gas from substrate compartment WC is at a negative potential with respect to the channel wall, it should be understood that, alternatively, the electrical circuit may be arranged to keep the rotors and/or outlets of the pumps 60, 62 of both compartment WC, PC at a negative potential with respect to the channel wall. This may have the advantage that the flush gas may be removed more effectively. On the other hand, keeping only the rotor and/or outlet of the pump 62 that pumps flush gas from substrate compartment WC at a negative potential may have the advantage that less contaminants may enter the optics compartment.

Electrodes 26 may be given any suitable shape for inducing AC electric fields in the cone. For example, the electrodes may include a series of mutually isolated sections disposed in respective sectors around the central axis of the cone.

Figure 3:
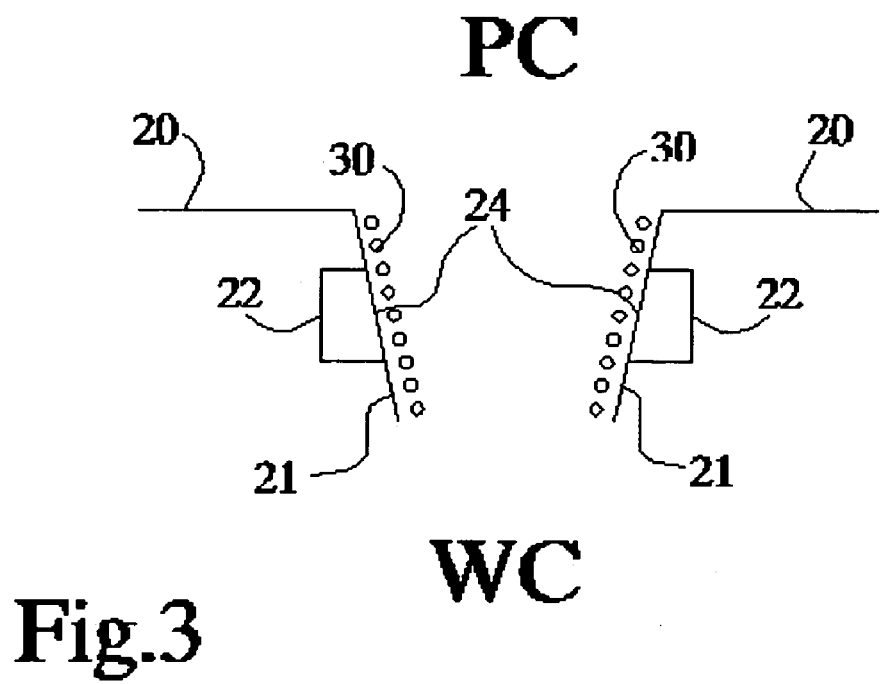
FIG. 3 shows an alternative to the embodiment shown in FIG. 1 using an electromagnetic field generated by an RF coil to ionize flush gas.

FIG. 3 shows an alternative embodiment in which electrodes 26 have been replaced by an RF coil 30 (shown schematically by means of cross-sections through turns). In this case, an RF source circuit (not shown) is applied to the terminals of coil 30 to generate the electromagnetic field that ionizes the flush gas. In addition, a DC current is preferably provided to apply a DC electric current through coil 30 to generate a magnetic field to reduce the extent to which the charged flush gas particles flow from the inner space of the cone. Magnetic field containment of ionized gas particles is known per se, so that the skilled person will be able to select a suitable field strength. In a further embodiment, separate coils may be used to generate the RF electromagnetic field and the DC magnetic containment field. Alternatively, a combination of electrodes and a coil may be used to generate the RF electromagnetic field and the DC magnetic containment field, respectively, or a combination of electrodes and a coil may be used to generate the DC magnetic containment field and the RF electromagnetic field, respectively.

Figure 4:
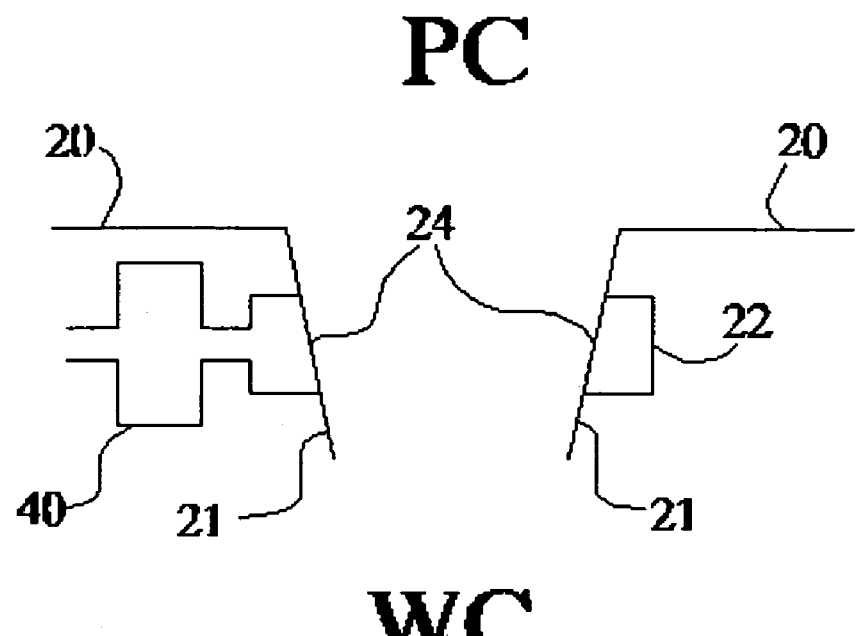
FIG. 4 shows an embodiment of the invention using an ionization chamber to ionize flush gas.

FIG. 4 shows a further embodiment in which a separate ionization chamber 40 has been added, from which ionized gas is supplied to perforated areas 24. In this case, no electrodes or coil is needed in or near the inner space of the cone for ionizing the gas. Any known type of ionization chamber may be used.

Figure 5:
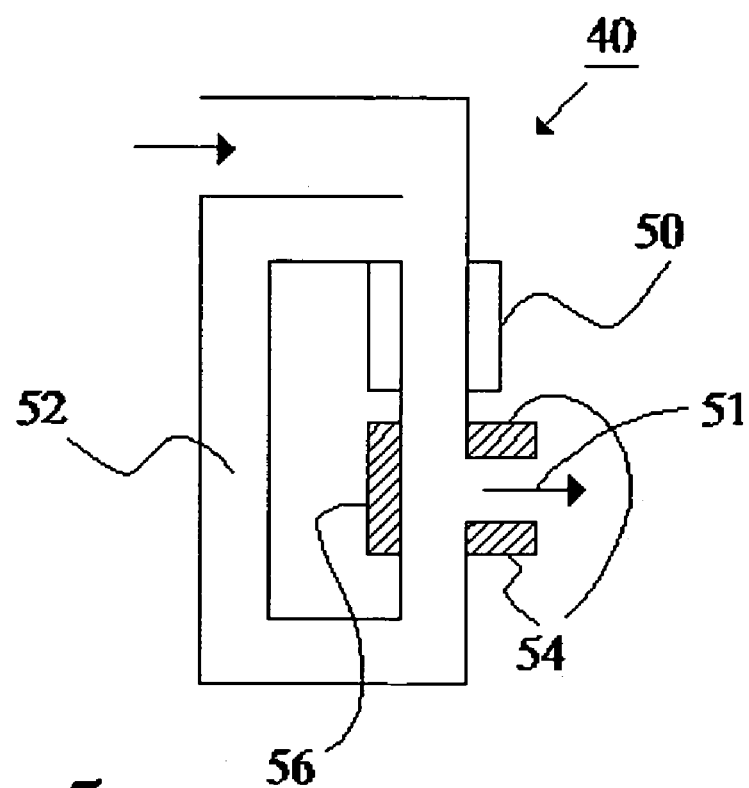
FIG. 5 shows an embodiment of an ionization chamber.

FIG. 5 shows an example of an ionization chamber 40. The ionization chamber 40 contains a conventional ionizing arrangement 50, such as a pair of electrodes between which an RF electric voltage difference is applied, or an RF coil. The flush gas flows from the inlet of the ionization chamber to an outlet 51 via the ionizing arrangement 50, so that molecules from the flush gas will be ionized. A gas flow circuit 52 is provided back from the outlet 51 to the ionizing arrangement 50. Electrodes 54, 56 are provided on the outlet and an inner surface facing the outlet. Typically, the outlet pipe is conductive so that it functions as an electrode in its entirety.

During operation, the electrodes 54 near the outlet (and preferably the entire outside wall of ionization chamber 40) are electrically grounded. A positive voltage relative to ground is applied to the electrode 56 on the inner surface facing the outlet. Thus, an electric field is created with field lines that run from the interior of ionization chamber 40 into the outlet pipe. The ionization arrangement 50 is active to ionize the gas. Typically, positively charged ions and electrons will be created. The electrons are absorbed by the walls, which are grounded. Gas travels from the ionization arrangement 50 to the outlet, and back along gas flow circuit 52 to the ionization arrangement 50. Because of the electric field that extends into the outlet, a relatively higher fraction of the positively charged ions in the gas leave through the outlet than the fraction of neutral gas particles that leaves through the outlet. The neutral gas particles return to the ionization arrangement 50. Thus, an increased ionization yield is realized.

Preferably, a current sensing circuit is included in the ionization arrangement 50, or attached to the channel wall if ionization is performed in the channel, to measure a net current that flows though all electrically conducting paths to a surrounding of the ionization space. This net current equals the net ion current from this space. By means of the output signal of such a current sensing circuit, various other potentials in the apparatus that affect the ion current may be controlled.

Although aspects of the invention have been described by reference to specific embodiments, it should be appreciated that the invention is not limited to these embodiments. For example, although a conically shaped channel has been shown between the different compartments, it will be understood that other shapes, e.g. a cylindrical shape, may be used for the channel. When used, a conical shape that substantially fits the converging shape of the projection beam B near the substrate is preferably used, so that the part of the space in the channel through which the beam B does not pass is substantially minimal, but sufficient space is used so that the beam B does not hit the channel wall 21 or any electrode or coil structure in the channel. This may have the advantage that it may reduce the required gas flow. The specific size of the channel may be adapted to the size of the beam B. Furthermore, although an embodiment has been described in which the walls of the compartments are electrically conductive over their entire thickness, it should be understood that, alternatively, only part of the thickness may be electrically conductive, such as, for example, an electrically conductive coating on the surface of the wall that faces the substrate compartment and/or the optics compartment.

Furthermore, although the invention has been described for a lithographic apparatus with an (E)UV beam and reflective optical elements, it will be appreciated that the invention may also be applied to remove contaminants in refractive apparatus or at other wavelengths. However, the use of the invention for (E)UV equipment may have particular advantages because of the difficulty of combining high beam intensity with protection against contaminants at (E)UV wavelengths.

Furthermore, although the use of perforations along a full circle in the channel wall 21 has been described for introducing the flush gas in the channel, it should be understood that the gas may be supplied through other means, such as larger openings in the channel wall 21, or openings that are not arranged along the full circle around the axis of the cone. In a further embodiment, the gas may even be supplied to the channel from one of the compartments PC, WC. However, direct supply into the channel from a place where the gas flows through the channel to reach any of the compartments PC, WC may have the advantage that a maximum amount of gas may be provided in the channel with a minimum of gas flow.

Although measures such as use of an ionized flush gas serve to reduce the flow of contaminants to the optics compartment, they do not entirely prevent problems with contaminants. For example, some contaminants may first linger in the substrate compartment WC and reach the optics compartment PC later, or affect a later processed substrate. Therefore, preferably, measures are taken to reduce the level of contaminants that linger in the substrate compartment WC. One measure involves temporary electrical charging of an electrically exposed area on the substrate table WT at the position on this substrate table WT where the substrate is placed during normal processing. The charged exposed area is then used to capture contaminant particles. Preferably, a negative charge is used in order to attract positively charged particles that typically form the majority of the contaminants.

In a first embodiment, for this purpose, during an interruption of processing of successive substrates, a conductive object is placed on the substrate table WT and charged to attract contaminants.

Figure 6:
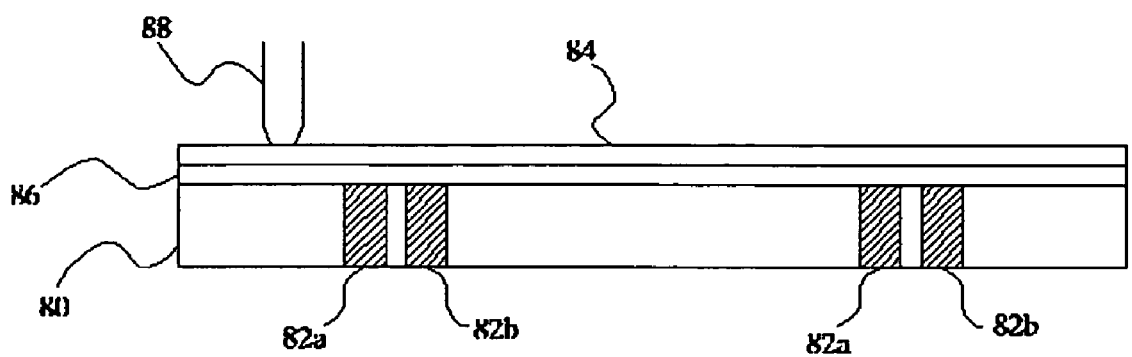
FIG. 6 shows a side view of a substrate table wherein pairs of electrodes are provided.
Figure 7:
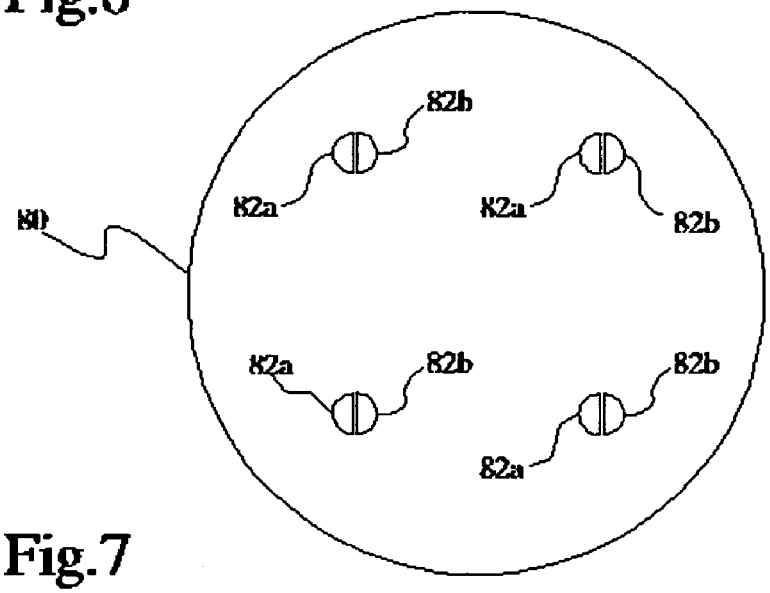
FIG. 7 illustrates a top view of part of the substrate table of FIG. 6.

FIG. 6 shows a side view of a part 80 of substrate table in which pairs of electrodes 82a,b are provided, and a conductive object 84 has been placed on top of the table, separated from the electrode pairs 82a,b by an isolating layer 86 (isolating layer 86 is shown with exaggerated thickness). A charging electrode 88 is shown in contact with object 84. FIG. 7 illustrates a top view of the part 80 of the substrate table, containing pairs of electrodes 82a,b at a number of positions.

In the prior art, it has been known to use pairs of electrodes 82a,b during normal processing to attract substrates to the substrate table. In the prior art, opposite potentials are applied to the electrodes 82a,b, for example, a positive potential to a first electrode 82a of each pair and a negative potential of equal but opposite value to the second electrode 82b of each pair. In this way, an electric field may be created between the electrodes 82a,b. This electric field causes a local electrical polarization of the substrate, with positive charge gathering over the electrode 82b at negative potential and negative charge gathering over the electrode 82a at positive potential. Thus, an attraction force may be realized between the substrate and the pair of electrodes 82a,b. The gathered electric charge counteracts the electric field outside the areas between the electrodes 82a,b.

In operation, according to one aspect of the invention, during interruptions of normal processing, for example, daily interruptions during which various forms of maintenance are performed, a conductive object 84 is placed on the substrate table. This object 84 typically has substantially the same diameter as ordinary substrates, so that it covers most of the top of the substrate table. A net charge is induced in the object.

In one embodiment, the net charge is induced by placing a charging electrode 88 at least initially in electrical contact with object 84, and applying an electrical potential difference between charging electrode 88 and the common mode potential of at least one pair of the electrodes 82a,b. Typically, the same potential is applied to both electrodes 82a,b of a pair. Preferably, the potential applied to object 84 differs from the ground potential that is applied to the walls of substrate compartment WC. This results in a net charge in the object 84. This net charge is drawn into the object 84 through charging electrode 88. Subsequently, the charge will keep the potential of conductive object 84 different from the potential of the walls of the substrate compartment, even if electrical contact between charging electrode 88 and object 84 is interrupted. The potential difference results in an electric field from the object 84 to the walls. This electric field draws charged contaminant particles from the substrate compartment WC, and possibly also from the optics compartment PC towards object 84.

Preferably, while in the charged state, the substrate table WT is moved around in the substrate compartment WC to attract contaminant particles from different positions. Before movement, contact between charging electrode 88 and object 84 is preferably removed to avoid mechanical problems. Preferably, the substrate table WT is moved at least to the positions where, during normal operation, substrates on the substrate table WT are illuminated by the patterned beam B. Preferably, however, the substrate table WT is moved to other positions as well, to which the substrate table is not normally moved during normal operation. This increases the probability that contaminant particles will be attracted.

After the object 84 has been used to attract particles, it is preferably moved to a position where the attracted contaminant particles may be removed from the object 84, without significant risk of contaminating the substrate compartment WC. The object 84 may be removed from the substrate compartment WC for example, through an access port that is normally used for removing and/or adding substrates. Preferably, the object 84 is discharged only when it has been removed from the substrate compartment WC, e.g. by establishing an electrical connection between the object and ground.

Although a specific method of charging has been described, it should be appreciated that other methods of charging may be used. For example, it is has been found that charge accumulates due to photoelectric effect when a substrate is illuminated with a beam of radiation. This charge accumulates until the substrate develops a certain potential consistent with the photoelectric effect. During processing of normal substrates, this is regarded as an undesirable effect, so that measures are typically taken to remove this charge. If a positive charge is needed for cleaning, this potential may be allowed to develop essentially unhindered and substantially to its maximum value, preferably while a substrate that is used for the purpose of cleaning (and not for obtaining integrated circuits from that substrate) is provided on substrate table during selected cleaning steps. In this embodiment, measures are taken to prevent development of such a potential during normal processing of substrates from which integrated circuits may be obtained. It may be noted that in this case, the speed of charging and the potential relative to the walls of the substrate compartment WC that can be reached are determined by the photoelectric effect. This speed is quite high, but the potential is limited to about 80-90 volts relative to ground. By using other ways of charging of the object 84, higher speeds and/or higher potentials may be reached.

As another example, a common mode potential may be applied to a pair of electrodes 82a,b relative to the (ground) potential of the walls of the substrate compartment WC.

Figure 8:
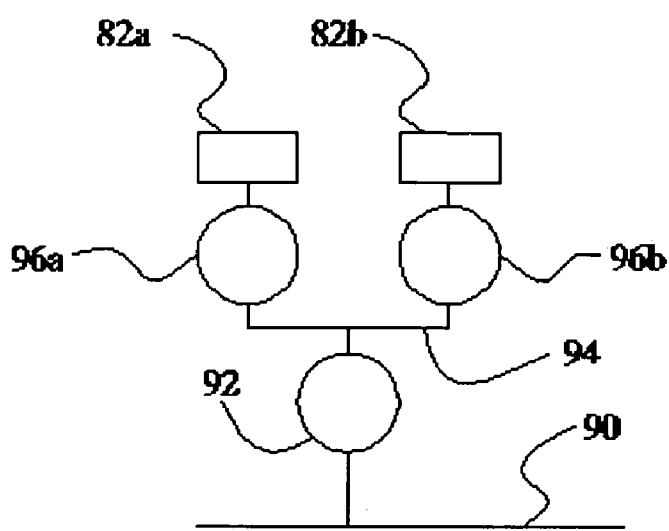
FIG. 8 shows an embodiment of an electrical circuit for applying a potential difference over a pair of electrodes.

FIG. 8 shows an example of a circuit for applying potentials to the electrodes 82a,b that contains differential voltage sources 96a,b and a common mode voltage source 92. Differential voltage sources 96a,b each couple a respective one of the electrodes 82a,b to a common node 94. Common mode voltage source 92 couples the common node 94 to ground 90. In normal operation, during projection of a pattern, common mode voltage source 92 applies a substantially zero voltage and differential voltage sources 96a,b apply voltages of mutually opposite polarity and equal size to the electrodes 82a,b. During cleaning, common mode voltage source 92 generates a non-zero voltage and differential voltage sources generate zero voltages so that the same voltage is applied to the electrodes 82a,b.

In this case, conductive object 84 acts as the middle electrode of a capacitive voltage divider, in which equal but opposite charges are induced on the surface of the object 84 that face the electrodes 82a,b and the walls of the substrate compartment WC, respectively. As a result the potential of the object 84 will substantially follow changes of the common mode potential of the electrodes 82a,b, since the capacitance from electrodes 82a,b to object 84 is much larger than the capacitance from the object 84 to the walls of the substrate compartment WC, due to the small distance from electrodes 82a,b to object 84. The common mode potential of an electrode pair 82a,b is preferably changed so much that the object 84 assumes a potential at a required difference relative to the potential of the walls of substrate compartment WC. It may be noted that in normal use, when a substrate is on the substrate table WT from which integrated circuits will be obtained, the common mode voltage of the electrodes 82a,b is preferably kept equal to the potential of the walls, or at a level so that the substrate assumes a potential equal to the potential of the walls of substrate compartment WC. During the collection of contaminants, a deviation from this typical situation may be created.

As another example of realizing a charge, a leakage current through isolating layer 86 may be used to charge object 84, from one of the electrodes 82a,b. In this case, the object 84 is preferably kept on substrate table WT for a sufficient duration to allow a net charge to leak to object 84. Normally, if equal currents leak from opposite electrodes 82a, 82b, no net charge is accumulated, but by creating an asymmetry, net charge accumulation may be realized. For example, a combination of object material of object 84, isolating layer 86 and electrodes 82a,b may be used that has a rectifying effect, leaking current of one polarity to a greater extent than current of an opposite polarity. As another example, electrodes 82a, 82b of mutually different size may be used during charging, so that different electric field strengths are created through isolating layer 86 at the respective electrodes. A dedicated charging electrode (not shown) in the substrate table may be provided to create such an asymmetry and used to charge object 84.

Although use of capture of contaminant particles during interruptions of normal processing using a charged surface on substrate table WT is preferably combined with the use of an ionized flush gas to reduce the problems that arise when the flush gas is temporarily removed, it should be understood that a charged surface on substrate table WT may also be applied in other circumstances, irrespective of whether a flush gas is used or whether this flush gas is ionized.

Although use of a fully conductive object 84 specifically for attracting charge has been described, it should be appreciated that other solutions are possible. The conductivity only needs to be sufficiently high so that charge distribution over the object 84 is possible within normal operating periods. For example, a semiconductor substrate may be used, such as a semiconductor wafer of the same type that is used during normal production, but that is not subjected to further processing steps that the normal semiconductor substrates are subjected to, to produce integrated circuits. In another embodiment, the conductive object 84 may even be omitted altogether, if the top part 80 of the substrate table is charged to a high potential. However, this may have the disadvantage that the top of isolating layer 86 should preferably be cleaned before a new substrate is placed on it. In a further embodiment, a temporary isolating contaminant capture layer may be placed on top of isolating layer 86 during cleaning. This temporary capture layer may be removed once the substrate table has been moved around in the substrate chamber to capture contaminant particles.

It should be understood that the term "exposed area" may refer to the part of any object on substrate table 80, or to part of the substrate table 80 from which electric field lines run outwards towards the walls starting substantially perpendicularly to the support surface of the table. Thus, the exposed area is at the top of table 80 in the electrical sense. In this sense, the term "exposed area" includes physical top surfaces, but it does not exclude the presence of electrically isolating layers between the electrically exposed area and the space of the substrate compartment.

Furthermore, it should be appreciated that, although it is preferred that the charged area extends over the entire top surface on substrate table 80 (typically the surface of object 84) and is charged with the charge of the same polarity (preferably a negative charge), in other embodiments an area that extends over only part of the surface may be charged, for example, because object 84 is conductive only over part of the surface. A conductive grid may be used as exposed area on the surface for example. Preferably, the part of the surface that is charged with the charge of the same polarity extends substantially to opposite extremities of the surface. This increases the amount of contaminants that will be captured. In another embodiment, separate parts of the exposed area may be charged with charges of opposite polarity. This has the disadvantage that the electric field away from the exposed area is lower than when a net charge of one polarity is used, but if the oppositely charged parts are sufficiently far apart (form two semicircle segments on the top surface, for example), some useful electric field strength will be generated in any case.

A similar technique may be applied to clean the surroundings of the reticle MA. In this case, an exposed area on top of the reticle table MT is charged and preferably moved about. However, it is typically desirable to use a charged exposed surface in on the substrate table more often, because more contaminants typically arise from the substrates W than in the vicinity of the reticle.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate, whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A device manufacturing method comprising:
    patterning a beam of radiation;
    positioning a substrate in a substrate compartment;
    projecting the patterned beam of radiation through an optics compartment and a channel that provides an open connection between the optics compartment and the substrate compartment onto the substrate;
    maintaining an ionized flush gas at a higher pressure in the channel than in the substrate compartment and in the optics compartment during said projecting;
    intercepting particles that emanate from the substrate with the ionized flush gas;
    pumping the flush gas carrying the intercepted particles from the substrate compartment using a pump coupled to a gas outlet of the substrate compartment coupled to at least one of said compartments; and
    establishing an electrical potential difference between a wall of the channel and the outlet and/or a rotor of the pump so that the outlet and/or the rotor of the pump attracts positively charged ions that stem from the ionized flush gas in the channel.

2. A device manufacturing method according to claim 1, further comprising maintaining electric potentials of walls of the optics compartment and/or the substrate compartment and any object in the optics compartment and/or the substrate compartment at a higher potential level than the outlet and/or the rotor of the pump.

3. A device manufacturing method according to claim 1, further comprising supplying the flush gas into the channel from an inlet in a wall of the channel between the substrate compartment and the optics compartment.

4. A device manufacturing method according to claim 3, further comprising ionizing the flush gas prior to supplying the flush gas through the inlet into the channel.

5. A device manufacturing method according to claim 1, wherein the flush gas is ionized using an alternating electromagnetic field generated in the channel.

6. A device manufacturing method according to claim 1, further comprising:
    placing a plurality of substrates on a substrate table in the substrate compartment successively,
    projecting the patterned beam onto the substrates, when each substrate is on the substrate table in the substrate compartment, respectively, to impart patterns to the substrates for further processing of the substrates;
    electrically charging an electrically exposed area on the substrate table to a surface potential different from a wall potential of the wall of the substrate compartment, during a period in which no substrate that is used for said further processing is on the substrate table, intermediate between projection onto successive ones of said substrates;
    positioning the substrate table with said charged exposed area during said period to a position to attract material from a space in the substrate compartment near said position; and
    removing the attracted material from the substrate table before placing a next one of the substrates on the substrate table.

7. A device manufacturing method according to claim 6, wherein an at least partially electrically conductive object, with a top surface that has substantially a same diameter as the substrates, is placed on the substrate table in said period, and at least part of the top surface of the object is charged to the surface potential.

8. A device manufacturing method according to claim 6, wherein the substrate table is moved while the electrically exposed area is at the surface potential.

9. A lithographic projection apparatus arranged to project a patterned beam of radiation from a patterning device onto a substrate, the lithographic projection apparatus comprising:
   a substrate compartment with a first gas outlet;
   an optics compartment with a second gas outlet;
   a channel that provides open gas and radiation communication between the optics compartment and the substrate compartment;
   a flush gas supply and flush gas ionizer arranged to establish a higher pressure of ionized flush gas in the channel than in the substrate compartment and the optics compartment;
   a pump coupled to at least one of the gas outlets for pumping the flush gas from at least one of the compartments; and
   an electric circuit arranged to establish an electrical potential difference between a wall of the channel and at least one of the outlets and/or a rotor of the pump, said circuit having a polarity so that at least one outlet and/or the rotor of the pump attracts positively charged ions that stem from the ionized flush gas in the channel.

10. A lithographic projection apparatus according to claim 9, wherein walls of the optics compartment and/or the substrate compartment and any objects in the optics compartment and/or the substrate compartment are electrically conductive at their surfaces, and electrically coupled to the electric circuit to maintain a potential of the wall of the optics compartment and/or the wall of the substrate compartment and the objects above a potential of the outlet and/or the rotor of the pump, and/or wherein the walls of the optics compartment and/or the wall of the substrate compartment and/or the objects are electrically isolated from the channel wall and the outlet and/or the rotor of the pump that is kept at an electrical potential difference between a wall of the channel.

11. A lithographic projection apparatus according to claim 9, further comprising a flush gas supply inlet in a wall of the channel, between the substrate compartment and the optics compartment.

12. A lithographic projection apparatus according to claim 11, further comprising an ionization chamber for ionizing the flush gas in a supply conduit for feeding flush gas to the inlet.

13. A lithographic projection apparatus according to claim 12, wherein the ionization chamber comprises a gas flow circuit with a branch coupled to the inlet, an electromagnetic field generator coupled to a part of the gas flow circuit for ionizing flush gas that flows through the circuit, and a second electric circuit is coupled between a wall of the branch and a wall of the gas flow circuit for establishing a potential difference between the wall of the branch and the wall of the gas flow circuit, with a polarity to attract ionized gas from the gas flow circuit into the branch.

14. A device manufacturing method comprising:
   patterning a beam of radiation;
   placing a plurality of substrates and patterning devices in a path of the beam successively, the substrates or patterning devices being placed on a support structure;
   projecting the beam from the patterning devices onto the substrates, to impart patterns to the substrates for further processing;
   electrically charging an electrically exposed area on the support structure to a surface potential different from a wall potential of a wall of a compartment that contains the support structure, during a period between projections of the beam onto successive ones of the substrates and wherein no substrate that is used for said further processing or patterning device is on the support structure;
   positioning the support structure with said charged, electrically exposed area during said period at a position to attract material from a space near said position; and
   removing the attracted material from the support structure before placing a next one of the substrates or the patterning devices on the support structure.

15. A device manufacturing method according to claim 14, wherein an at least partially electrically conductive object, with a top surface that has substantially a same diameter at the substrates, is placed on the support structure in said period instead of a substrate, and at least the top surface of the object is charged to the surface potential.

16. A device manufacturing method according to claim 15, wherein the support structure is moved while the electrically exposed area remains charged at the surface potential.

17. A device manufacturing method according to claim 15, wherein a pair of table electrodes is provided in the support structure facing the conductive object, a potential difference being applied to the table electrodes to hold the substrates or patterning devices on the support structure, a common mode potential being applied to the pair of table electrodes relative to the wall potential to charge the electrically exposed area to the surface potential.

18. A device manufacturing method according to claim 15, wherein a table electrode is provided in the support structure facing the conductive object substantially without conductive contact between the table electrode and the object, and a charging electrode is conductively connected to the object, a potential difference being applied between the charging electrode and the table electrode and the wall of the compartment.

19. A lithographic projection apparatus arranged to project a pattern from a patterning device onto a substrate, the lithographic projection apparatus comprising:
   a support structure for supporting the substrate or the patterning device during projection of the pattern, said support structure being in a compartment; and
   an electrical potential application circuit, arranged to establish a surface potential of an electrically exposed area on the support structure in a region that is normally occupied by the substrate or the patterning device during projection, the electrical potential application circuit being arranged to establish mutually different surface potentials relative to a wall potential of a wall of the compartment selectively during selected periods.

20. A lithographic projection apparatus according to claim 19, further comprising a pair of electrodes in the support structure, a differential potential application circuit arranged to apply a potential difference between the electrodes and a common mode potential application circuit connected between the wall and the pair of electrodes, and arranged to apply a potential difference between a common mode potential of the electrodes and a wall potential of the wall.

21. A lithographic projection apparatus arranged to project a patterned beam of radiation from a patterning device onto a substrate, the lithographic projection apparatus comprising:
- a walled substrate compartment with a gas outlet;
- a walled optics compartment with a gas outlet;
- a walled channel that provides open gas and radiation communication between the optics compartment and the substrate compartment;
- a flush gas ionizer with an output for supplying ionized flush gas; and
- a flush gas inlet in a wall of the channel between the optic compartment and the substrate compartment, coupled to the output, for feeding ionized flush gas into the channel.

22. A lithographic projection apparatus according to claim 21, wherein the ionizer comprises a gas flow circuit with a branch coupled to the inlet, an electromagnetic field generator coupled to a part of the gas flow circuit for ionizing flush gas that flows through the circuit, and an electric circuit coupled between a wall of the branch and a wall of the gas flow circuit for establishing a potential difference between the wall of the branch and the wall of the gas flow circuit, with a polarity to attract ionized gas from the gas flow circuit into the branch.

* * * * *